United States Patent [19]

Yokosawa et al.

[11] Patent Number: 5,021,739

[45] Date of Patent: Jun. 4, 1991

[54] SUPERCONDUCTOR TYPE RADIO FREQUENCY WITH ADJUSTABLE INDUCTANCE MAGNETIC FLUX MEASURING CIRCUIT

[75] Inventors: Koichi Yokosawa, Kokubunji; Hideki Kohno, Tama, both of Japan

[73] Assignee: Hitachi, Ltd., Tokyo, Japan

[21] Appl. No.: 426,188

[22] Filed: Oct. 25, 1989

[30] Foreign Application Priority Data

Nov. 2, 1988 [JP] Japan ................... 63-276249

[51] Int. Cl.$^5$ ............... G01R 33/035; G01R 33/20
[52] U.S. Cl. ................... 324/248; 324/318; 505/844; 505/846
[58] Field of Search ............. 324/225, 248, 307, 309, 324/318; 307/309; 505/844–846

[56] References Cited

U.S. PATENT DOCUMENTS

| | | | |
|---|---|---|---|
| 3,528,001 | 9/1970 | Yntema | 324/248 X |
| 3,965,411 | 6/1976 | Hesterman | 324/248 X |
| 4,864,237 | 9/1989 | Hoenig | 324/248 |
| 4,875,010 | 10/1989 | Yokosawa et al. | 324/248 |

FOREIGN PATENT DOCUMENTS

| | | | |
|---|---|---|---|
| 0169070 | 10/1983 | Japan | 324/248 |
| 0174866 | 10/1983 | Japan | 324/248 |
| 0143752 | 7/1985 | Japan | . |
| 0235876 | 9/1988 | Japan | 324/248 |

OTHER PUBLICATIONS

Hilbert et al.; "Nuclear Quadrupole . . . with a DC Superconducting Quantum Interference Device", Appl. Phys. Lett. 47(6), Sep. 15, 1985, pp. 637-637.

Primary Examiner—Gerard R. Strecker
Attorney, Agent, or Firm—Antonelli, Terry, Stout & Kraus

[57] ABSTRACT

An RF magnetic flux measuring circuit uses a SQUID fluxmeter of which the input and output characteristics establish a periodic function, and in which a pick-up coil for picking up desired RF magnetic flux and an input coil of the SQUID fluxmeter are connected to form a closed loop which is a superconducting loop for transferring the magnetic flux to the SQUID. There is also provided an inductance adjusting device which adjusts the inductance of the superconducting loop to limit the magnetic flux that crosses the SQUID fluxmeter within a range of a single-valued function in said input and output characteristics.

9 Claims, 3 Drawing Sheets

SUPERCONDUCTOR TYPE RADIO FREQUENCY WITH ADJUSTABLE INDUCTANCE MAGNETIC FLUX MEASURING CIRCUIT

BACKGROUND OF THE INVENTION

The present invention relates to a magnetic flux detecting circuit which uses a SQUID fluxmeter, and more particularly to a magnetic flux detecting circuit adapted to detecting nuclear magnetic resonance signals.

In recent years, it has been attempted to use a SQUID (superconducting quantum interference device) fluxmeter as a magnetic flux detector for a nuclear magnetic resonance (NMR) apparatus or a magnetic resonance imaging (MRI) apparatus. An example which is applied to the MRI apparatus has been disclosed in Japanese Patent Laid-Open No. 60-143752 (1985).

In the conventional art, the generated MRI signals are detected by a magnetic flux detecting coil of a quadratic differentiation type, and are sent to a SQUID via a transfer circuit made of normally conducting matter.

The SQUID used in the conventional art is called dc-SQUID and its V-$\phi$ characteristics establish a periodic function in relation to $\phi$ as shown in FIG. 8, where symbol V denotes an output voltage of the SQUID and $\phi$ denotes a magnetic flux input to the SQUID.

The SQUID fluxmeter of the above prior art uses a FLL (flux locked loop) in order to impart linearity to the relationship between the magnetic flux and the voltage.

Theoretically, the magnitude of magnetic flux signals of MRI and NMR varies in proportion to the square of the frequency of the signals. Further, the frequency of the signals vary in proportion to the intensity of a static magnetic field applied to a body or a sample to be tested. In order to improve the S/N ratio of signals by increasing the magnitude of signals, therefore, it is necessary to intensify the static magnetic field and to increase the resonance frequency. With the conventional SQUID fluxmeter using FLL, however, it was not able to detect magnetic flux signals of a frequency in excess of 100 KHz due to limitation on the response characteristics of the FLL.

Magnetic flux detecting circuits based on the SQUID without using FLL have been disclosed in, for example, Applied Physics Letters, Vol. 47(6), pp. 637–639 and in U.S. Pat. No. 4,875,010 having some of the same inventors as the present application. The former example teaches an art in which a capacitor is inserted in a superconductive loop that couples a pick-up coil to the SQUID such that the loop works as a resonance circuit, and in which a Q spoiler is further inserted in the loop. The latter example teaches an art in which part of the superconductive loop is rendered to be normally conductive during the periods other than a period in which a desired signal is generated, in order to suppress undesired noise signals by the resistance.

SUMMARY OF THE INVENTION

The aforementioned two magnetic flux detecting circuits without the FLL are used for detecting nuclear magnetic resonance signals. Such magnetic flux detecting circuits without FLL are no more capable of producing detect outputs that correspond to a true magnetic flux when the input magnetic flux exceeds a predetermined range due to periodicity in the V-$\phi$ characteristics of the SQUID fluxmeter.

It is possible to use these detecting circuits in a range in which the magnetic flux $\phi$ and the detect output V correspond to each other in a one-to-one manner by adjusting the magnitude of an exciting pulse that excites nuclear spin and adjusting the flip angle of the spin thereby to adjust the magnetic flux input to the SQUID fluxmeter. According to this method, however, it is difficult to maintain a required S/N ratio.

An object of the present invention therefore is to provide an RF magnetic flux detecting circuit which can be used in an RF band to detect signals maintaining a high S/N ratio.

Another object of the present invention is to provide a detecting circuit which is capable of detecting magnetic flux of a high frequency while maintaining a one-valued function in the input vs. output characteristics or maintaining nearly linear characteristics.

A further object of the present invention is to provide a detecting circuit adapted to detecting nuclear magnetic resonance signals.

The feature of the present invention resides in a constitution which has a superconducting loop that contains a pick-up coil that picks up a desired RF magnetic flux and an input coil of a SQUID fluxmeter that converts the magnetic flux into a voltage output, and wherein provision is made of inductance adjusting means for adjusting the inductance of the super-conducting loop.

A representative example of the above-mentioned inductance adjusting means consists of a super-conducting coil for adjusting the inductance that is connected in series or in parallel with the input coil of the SQUID fluxmeter, and in which the inductance of the coil is adjusted depending upon a position at which the rod having a predetermined permeability is inserted in the coil, and whereby the inductance of the whole superconducting loop is adjusted and the transfer rate is adjusted from the pick-up coil to the SQUID fluxmeter.

By adjusting the inductance adjusting means depending upon a maximum value in the amount of magnetic flux to a predetermined pick-up coil, it is made possible to limit the magnetic flux input to the SQUID fluxmeter within a range in which the input vs. output characteristics of the SQUID fluxmeter establish a single-valued function or remain nearly linearly.

DESCRIPTION OF THE PREFERRED EMBODIMENTS

Figure 1:
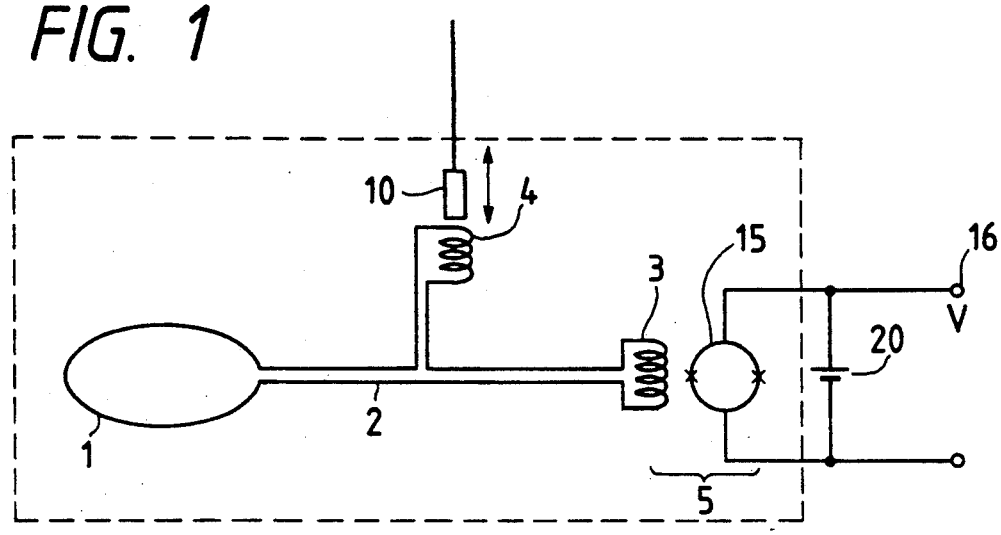
FIGS. 1 to 6 are circuit diagrams illustrating embodiments of the present invention.

FIG. 1 shows a magnetic flux detecting circuit according to an embodiment of the present invention. In a SQUID (super-conducting quantum interference device) fluxmeter 5, there are an input coil 3, a pick-up coil 1 and a coil 4 for adjusting inductance, that are connected together through a transmission line 2 to form a super-conducting loop. That is, the coil 4 is connected in series with the input coil 3. When these coils and transmission lines are composed of niobium that is now widely used, means is necessary to maintain a region surrounded by a dotted line in FIG. 1 at the temperature of liquid helium. The pick-up coil 1 is crossed by the magnetic flux of signals of a radio-frequency band that is to be measured. A representative source of signals is a body to be tested in a nuclear magnetic resonance apparatus. Due to this magnetic flux, an RF current flows into the super-conducting loop, and a magnetic flux is generated from the input coil 3 of the SQUID fluxmeter 5. Due to the magnetic flux that crosses the SQUID ring 15, a detect output of a voltage V is obtained from an output terminal 16, and the magnetic flux generated from the source of signals is measured. Reference numeral 20 denotes a power source that supplies a direct current to give bias to the SQUID fluxmeter 5. In the coil for adjusting inductance is incorporated a rod 10 composed of a material that has a permeability different from those of the surrounding environment. The depth for inserting the rod 10 in the coil 4 can be varied, and the inductance of the coil 4 is adjusted by adjusting the depth of insertion.

Here, if the inductance of the pick-up coil 1 is denoted by $L_p$, the inductance of the transmission line by $L_w$, the inductance of the SQUID coil 3 by $L_i$, the inductance of the coil 4 by $L_v$, and if the mutual inductance of the SQUID input coil 3 and SQUID loop 15 is denoted by M, then a ratio (magnetic flux transfer rate) of a magnetic flux $\phi_p$ that crosses the pick-up coil to a magnetic flux $\phi_i$ that crosses the SQUID ring is given by the following relation, $$\phi_i/\phi_p = \frac{M}{L_p + L_w + L_i + L_v} \quad (1)$$

Figure 8:
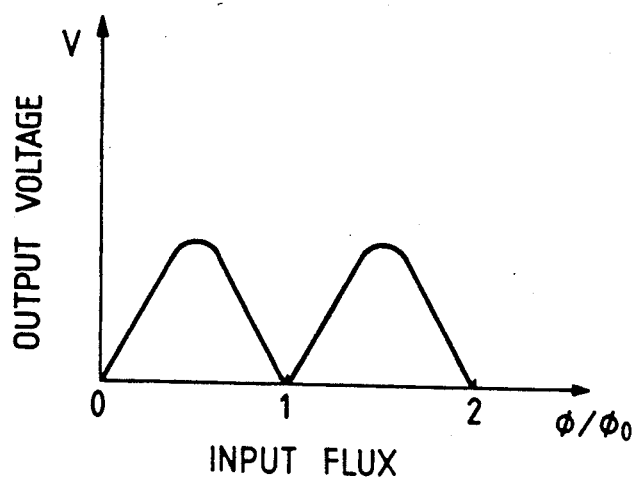
FIG. 8 is a diagram illustrating input and output characteristics of a SQUID fluxmeter.

By adjusting $L_v$, therefore, the magnetic flux transfer rate can be adjusted. Therefore, $L_v$ is adjusted depending upon an expected maximum value of $\phi_p$ and whereby the input magnetic flux $\phi_i$ the SQUID fluxmeter 5 is prevented from exceeding $\phi_0/2$ in FIG. 8 and there is obtained a detect output having a voltage V that can be corresponded to $\phi_p$ in a one-to-one manner. If $L_v$ is varied more greatly such that $\phi_i$ lies over nearly a straight rising region in the first period of V-$\phi$ characteristics of FIG. 8, then it is made possible to obtain a linear detect output for the value $\phi_p$.

Figure 2:
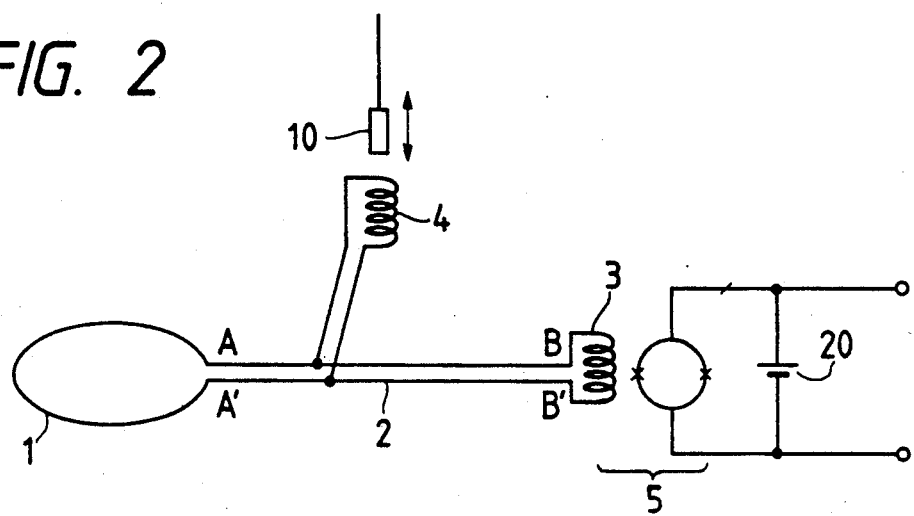

FIG. 2 illustrates another embodiment in which the coil 4 for adjusting inductance is arranged in parallel with the SQUID input coil 3. Other reference numerals denote the same portions as those described in conjunction with FIG. 1. In the case of FIG. 2, the magnetic flux transfer rate $\phi_i/\phi_p$ is given by the following relation, $$\phi_i/\phi_p = \frac{L_v}{L_i + L_v} \cdot \frac{M}{L_p + L_w + \frac{L_i \cdot L_v}{L_i + L_v}} \quad (2)$$

Like the case of FIG. 1, therefore, the position of the rod 10 is varied to adjust the inductance $L_v$ and to adjust the magnetic flux transfer rate, thereby to obtain a detect output V that corresponds to $\phi_p$ in a one-to-one manner.

Figure 3:
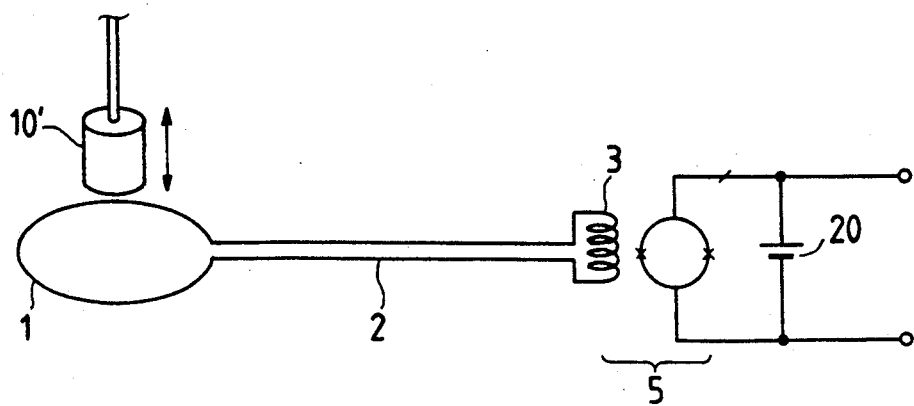

FIG. 3 illustrates a further embodiment. This embodiment has no independent coil for adjusting inductance but in which the pick-up coil 1 and the SQUID input coil 3 are connected together through the transmission line 2 to form a closed loop. The rod 10' composed of a material having a permeability different from those of the surrounding environment is inserted in the pick-up coil 1 of which the inductance is then adjusted by varying the depth of insertion. The magnetic flux transfer rate $\phi_i/\phi_p$ can then be adjusted quite in the same manner as in the embodiment of FIG. 1.

In the above embodiments, the rod 10 or 10' may be composed of a super-conducting material. In this case, the rod has a permeability $\mu$ which is zero. Therefore, the inductance can be effectively varied by using a small rod.

Figure 4:
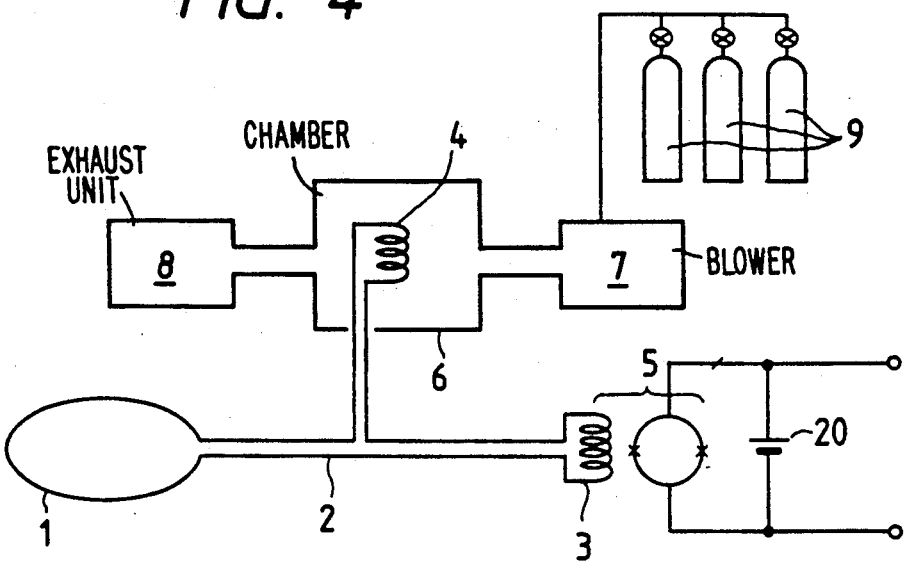

FIG. 4 illustrates an embodiment for adjusting the inductance by changing the surrounding atmosphere of the inductance-adjusting coil 4. The coil 4 is contained in a chamber 6 and the inductance of the coil 4 is finely adjusted by selectively supplying gases having dissimilar permeabilities such as oxygen, nitrogen, helium and the like from gas containers 9 into the chamber 6 by a blower 7. An exhaust unit 8 coupled to the chamber 6 is also used to replace the gas. The coil 4 should preferably be composed of a high-temperature super-conducting material It is also allowable to change the atmosphere for the pick-up coil 1 or the input coil 3 to change the inductance thereof without using an independent inductance-adjusting coil like in the embodiment shown in FIG. 3. It is further possible to contain the whole magnetic flux transfer circuit in a chamber to change the atmosphere for the whole circuit.

Figure 5:
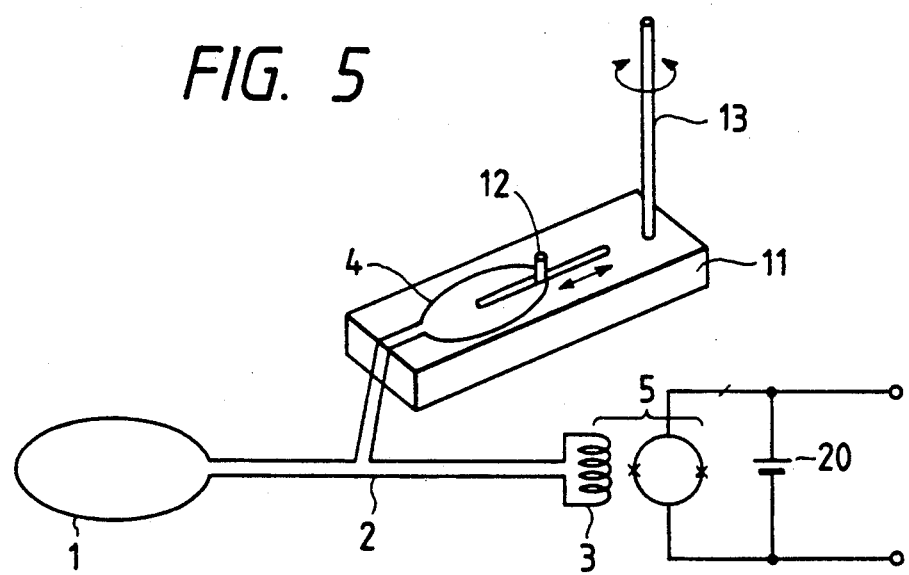

FIG. 5 shows an embodiment for adjusting the inductance by changing the shape of the inductance adjusting coil. If an adjusting rod 13 of a shape adjusting unit 11 added to the coil 4 is turned, a pin 12 moves along the groove to change the ratio of a long axis and a short axis of the oval coil 4. This makes it possible to adjust the inductance of the coil 4. Parts of the shape-adjusting unit 11 are composed of non-magnetic materials.

Figure 6:
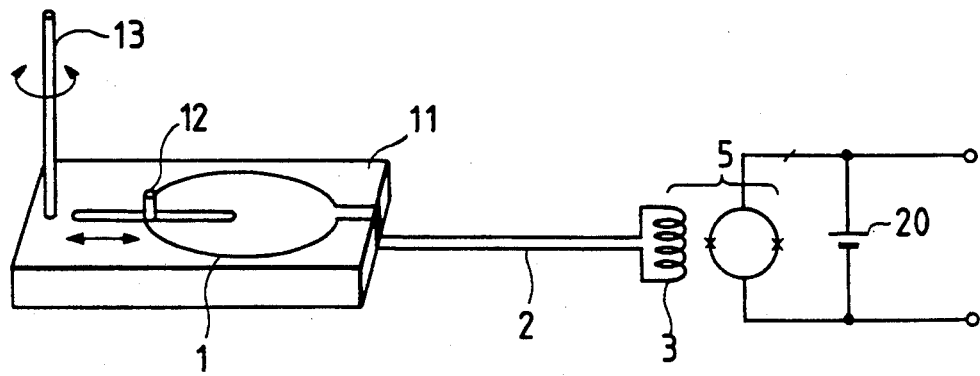

FIG. 6 shows an embodiment in which the shape-adjusting unit 11 which is the same as that of FIG. 5 is added to the pick-up coil 1. Even in the embodiments of FIGS. 5 and 6, the inductance is varied in the circuit that transfers magnetic flux to the SQUID fluxmeter like in the embodiments of FIGS. 1 to 4; i.e., the magnetic flux transfer rate changes making it possible to adjust a maximum value in the magnetic flux $\phi_i$ input to the SQUID fluxmeter. In the embodiment of FIG. 6, furthermore, the inductance changes and the area of the pick-up coil changes, too, such that a maximum value of $\phi_i$ changes.

Figure 7:
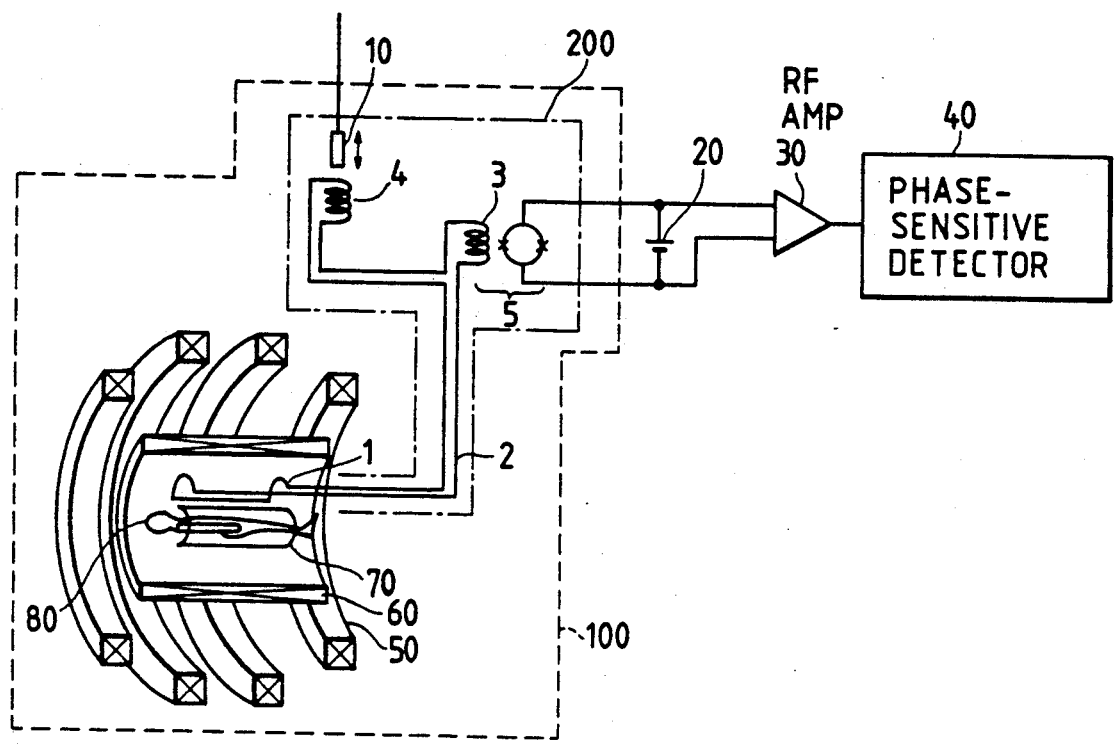
FIG. 7 is a circuit diagram illustrating a constitution in which the circuit of the present invention is adapted to an MRI apparatus.

A nuclear magnetic resonance imaging system (MRI system) employing the magnetic flux detecting circuit of the present invention will now be described in conjunction with FIG. 7.

A body 80 to be tested is inserted in a uniform magnetic field generated by a static magnetic field coil 50. Inside the static magnetic field coil is provided a gradient coil 60 that gives a desired field gradient to the static magnetic field. Near the body 80 to be tested are further provided an RF coil 70 that generates an RF magnetic field to excite a nuclear spin in the body 80 to be tested and a pick-up coil 1 that detects nuclear magnetic resonance signals from the body to be tested. The pick-up coil 1, transmission line 2, coil 4 for adjusting inductance, adjusting rod 10, SQUID fluxmeter 5, and power source 20 for biasing, are all constituted in the same manner as those shown in FIG. 1. That is, the inductance of the super-conducting loop that transfers the magnetic flux to the SQUID fluxmeter 5 is adjusted by adjusting the position of the rod 10, and the magnetic flux transfer rate of the magnetic flux transfer circuit is adjusted. Therefore, even when the nucelar magnetic resonance signals generated by the body 80 to be tested become a maximum, the magnetic flux $\phi_i$ that crosses the SQUID ring of the SQUID fluxmeter 5 is so adjusted as will not exceed $\phi_0/2$ of FIG. 8, and there are obtained detect outputs that correspond to nuclear magnetic resonance signals in a one-to-one manner. The detect outputs of the SQUID fluxmeter 5 are input to a phase-sensitive detector 40 via an RF amplifier 30, are sampled by a signal processing system that is not diagramed, and are subjected to the processing for imaging.

Except the body 80 to be tested, the interior of the MRI apparatus 100 is immersed in the liquid helium to maintain the super-conducting condition. Further, the signal detecting portions designated at 2, 3, 4 and 5 are provided with a magnetic shield 200 and are shielded from the intense magnetic field of the MRI apparatus.

The magnetic flux detecting circuit of the present invention without having FLL can operate at high speeds, and can detect magnetic flux of signals of greater than 10 MHz. In the MRI system which is shown in FIG. 7, the signal frequency varies in proportion to the intensity of the static magnetic field. In a system which uses hydrogen as an object nuclear seed, the signal frequency is 42.6 MHz when the intensity of the static magnetic field is 1T. Even in such a case, the magnetic flux detecting circuit of the present invention operates effectively.

What is claimed is:

1. A magnetic flux measuring circuit for measuring the magnitude of radio-frequency (RF) magnetic flux comprising:
   a superconducting loop, said superconducting loop including a pick-up coil for converting said RF magnetic flux into an electric current that flows through said superconducting loop, and an input coil for a superconducting quantum interference device fluxmeter that converts said electric current into a voltage output; and
   an inductance adjusting means for adjusting the inductance of said superconducting loop; whereby the magnitude of said voltage output provides measurement of the magnitude of said RF magnetic flux.

2. A magnetic measuring circuit according to claim 1, wherein said inductance adjusting means consists of an additional coil which is inserted in series with said input coil of said superconducting loop, and the inductance of said additional coil can be varied.

3. A magnetic flux measuring circuit according to claim 2, wherein the inductance of said additional coil is adjusted by adjusting the position of a rod having a predetermined permeability that is inserted in said additional coil.

4. A magnetic flux measuring circuit according to claim 2, wherein the inductance of said additional coil is adjusted by changing he kind of gas in a chamber in which said additional coil is placed.

5. A magnetic flux measuring circuit according to claim 2, wherein the inductance of said additional coil is adjusted by changing the shape of said additional coil.

6. A magnetic flux measuring circuit according to claim 1, wherein said inductance adjusting means consists of an additional coil which is connected in parallel with said input coil of said superconducting loop, and the inductance of said additional coil can be varied.

7. A magnetic flux measuring circuit according to claim 1, wherein said inductance adjusting means consists of a rod having a predetermined permeability which can be inserted in said pick-up coil at different depths.

8. Magnetic flux measuring circuit according to claim 1, wherein said inductance adjusting means changes the shape of said pick-up coil.

9. A magnetic flux measuring circuit for measuring the magnitude of radio-frequency (RF) magnetic flux comprising:
   a SQUID fluxmeter including a SQUID ring which derives an output voltage form input to said SQUID ring induced by said RF magnetic flux.
   a superconducting loop, said superconducting loop including a pick-up coil for converting said RF magnetic flux into an electric current that flows through said superconducting loop, and an input coil that induces a signal in said SQUID ring to produce said output voltage, and
   an inductance adjusting means for, prior to measurement of said to-be-detected RF magnetic flux, adjusting the inductance of said superconducting loop to a constant value so that the ratio of RF magnetic flux crossing said pick-up coil to said output voltage from said SQUID fluxmeter results in only one value of said input Rf magnetic flux corresponding to said output voltage of said SQUID fluxmeter.

* * * * *